(12) United States Patent
Murata et al.

(10) Patent No.: US 6,294,878 B1
(45) Date of Patent: Sep. 25, 2001

(54) PIEZOELECTRIC TRANSFORMER, PIEZOELECTRIC INVERTER AND LIQUID CRYSTAL DISPLAY

(75) Inventors: Koji Murata, Kusatsu; Etsuo Nishikawa, Shiga-ken, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/527,174

(22) Filed: Mar. 17, 2000

(30) Foreign Application Priority Data

Apr. 14, 1999 (JP) .................................................. 11-107125

(51) Int. Cl.[7] .................................................. H05B 37/02
(52) U.S. Cl. .................................. 315/209 PZ; 315/276; 315/209 R; 310/311; 310/348; 310/344
(58) Field of Search .......................... 315/209 PZ, 209 R, 315/276, 266; 310/311, 344, 345, 348, 359; 313/506, 511; 427/416, 417, 436

(56) References Cited

U.S. PATENT DOCUMENTS 5,753,381 * 5/1998 Feldman et al. ...................... 428/696
5,998,909 * 12/1999 Kumasaka et al. ................... 310/348
5,998,938 * 12/1999 Comberg et al. .............. 315/209 PZ
6,037,705 * 3/2000 Kawabata et al. .................... 310/345

FOREIGN PATENT DOCUMENTS 8-32139   2/1996 (JP) .
8-64884   3/1996 (JP) .

* cited by examiner

Primary Examiner—Haissa Philogene
(74) Attorney, Agent, or Firm—Ostrolenk, Faber, Gerb & Soffen, LLP

(57) ABSTRACT

The present invention provides a piezoelectric transformer, a piezoelectric inverter, and a liquid crystal display with a high reliability, capable of preventing the occurrence of the soundings caused by the contact between gold thread wires and preventing the breaking of the gold thread wires and the deterioration of the performance of the piezoelectric transformer. The gold thread wire for wiring used in a piezoelectric transformer has a structure wherein band-like metallic foils are wound around a core consisting of numerous fine wires bundled, and the gold thread wire is constituted by impregnating it with wax.

10 Claims, 4 Drawing Sheets

PIEZOELECTRIC TRANSFORMER, PIEZOELECTRIC INVERTER AND LIQUID CRYSTAL DISPLAY

BACKGROUND OF THE INVENTION

1. Field of the Invention

The present invention relates to a piezoelectric transformer used for the inverter for lighting the backlight of a liquid crystal display, the inverter for lighting a fluorescent lamp and the high-voltage power circuit of a copier or the like, and the piezoelectric inverter and the liquid crystal display using the same.

2. Description of the Related Art

As a well known piezoelectric transformer, there is a Rosen type piezoelectric transformer comprising a driving section wherein a pair of input electrodes are formed on a rectangular planar piezoelectric plate and which is polarized in the thickness direction, and a power generation section wherein an output electrode is formed on the end face in the longitudinal direction and which is polarized in the longitudinal direction. This type of piezoelectric transformer is constituted so as to mechanically vibrate the piezoelectric plate by applying an input voltage to the input electrodes via the input side wiring, and to take out the output voltage of AC high voltage generated at the output electrode via the output side wiring. As a lead for each the above-mentioned wiring, a lead that least inhibits vibration and that is not broken by vibration is desired. There is proposed, therefore, a piezoelectric transformer using, as leads for wiring, gold thread wires which have a flexibility and a good vibration-following property (Japanese Unexamined Patent Publications No. 8-32139 and No. 8-64884).

Conventional gold thread wires used as leads for wiring of a piezoelectric transformer are classified into three types as follows: a type having a structure wherein a copper foil (metallic foil) 7b in the shape of band is singly wound spirally around a core 7a consisting of numerous fine wires bundled, as shown in FIG. 6A and 6B; a type having a structure wherein two copper foils 7b are doubly wound around the core 7a in the same direction to increase the mechanical strength (bending strength), as shown in FIG. 7A; and a type having a structure wherein two copper foils 7b are doubly wound around the core 7a in the directions such that the two copper foils intersect each other, as shown in FIG. 7B. These gold thread wires are soldered at the input electrodes or the output electrode for connection.

However, in the conventional piezoelectric transformer using the above-described gold thread wires, there has been problems that, when a gold thread wire contacts or approaches the piezoelectric plate or a mounting board in the vicinity of the gold thread wire, it vibrates concurrently with the vibration of the piezoelectric transformer during operation, thereby causing soundings, and wearing copper foils of the gold thread wire, with the result that it becomes thin, and incurs a bad electrical conduction, or even a breaking under certain circumstances.

Further, there has been another problem that, when using a gold thread wire with doubly-wound copper foils, the friction between copper foils causes the copper foils to wear, thereby incurring the thinning or breaking of the wire.

Moreover, because the copper foil of a conventional gold thread wire directly contacts air, the copper foil is oxidized with time, and thereby its solderability (wettability toward solder) deteriorates, so that adequate fillets for soldering may be not formed, providing a bad soldering.

Also, there have been a problem that, when soldering a conventional gold thread wire, solder is easily wicked to the outer peripheral surface and the inside of the gold thread wire, thereby the solder wicked impairing the flexibility of the gold thread wire, and inhibiting (suppressing) the vibration of the piezoelectric transformer, which results in the deterioration of the performance of the piezoelectric transformer.

In recent years, there is an growing need for the size reduction of equipment using a piezoelectric transformer, and accordingly, the size reduction of the piezoelectric transformer itself is also strongly demanded. Now that the shortening of the gold thread wire for wiring having thus become a necessity for the piezoelectric transformer, the above-described problems are increasingly manifesting themselves.

SUMMARY OF THE INVENTION

Accordingly, it is an object of the present invention to provide a piezoelectric transformer, a piezoelectric inverter, and a liquid crystal display with a high reliability, capable of preventing the occurrence of the soundings caused by the contact between gold thread wires and preventing the breaking of the gold thread wires and the deterioration of the performance of the piezoelectric transformer.

In order to achieve the above-described object, the piezoelectric transformer in accordance with the present invention is characterized by a piezoelectric transformer which has a piezoelectric transformer element disposed on a mounting board and which uses gold thread wires for connecting the electrode of the piezoelectric transformer element and the electrode of the mounting board, wherein the metallic foil of the gold thread wires are coated with a coating material.

Also, the piezoelectric transformer in accordance with the present invention is characterized by a piezoelectric transformer which has a piezoelectric transformer element disposed on a mounting board and which uses gold thread wires for connecting the electrode of the piezoelectric transformer element and the electrode of the mounting board, wherein the gold thread wires are coated with, and penetrated into by a coating material.

As a coating material as mentioned above, a resin adhesive such as a flexible silicone-base adhesive, or a lubricant such as silicone oil or grease may be used.

The piezoelectric inverter in accordance with the present invention is characterized by comprising the abovedescribed piezoelectric transformer.

The liquid crystal display in accordance with the present invention is characterized by comprising the abovedescribed piezoelectric transformer or piezoelectric inverter.

In accordance with the piezoelectric transformer having the above-described constitution, even if the gold thread wire vibrates at the state of contacting members in the vicinity, it slips off the members contacted by virtue of the coating material, or its conditions of contact with the members is mitigated by the coating material. This permits the prevention of the occurrence of soundings and the wear of metallic foil. Further, in the case of the gold thread wire with doubly-wound metallic foils, or triply-wound metallic foils, it is possible to prevent the metallic foil from the wear due to the friction between the metallic foils by inserting the coating material between the metallic foils. Thereby the gold thread wire can be prevented from thinning or breaking.

Further, the metallic foil of the gold thread wire is separated from air by the coating material, and hence it can be prevented from oxidation. This allows the avoidance of a bad soldering such as a cold joint due to the oxidation of gold thread wire.

In addition, by making the coating material penetrate to the inside of the gold thread wire (core portion), it is possible to suppress the wicking of solder to the inside of the gold thread wire during soldering. This allows the flexibility of the gold thread wire to be maintained, and thereby allows the performance of the gold thread wire to be prevented from deterioration.

Since the piezoelectric inverter in accordance with the present invention is constituted so as to comprise a piezoelectric transformer possessing the above-described features, it has an excellent performance and a high reliability.

Also, since the liquid crystal display in accordance with the present invention is constituted so as to comprise a piezoelectric transformer or piezoelectric inverter possessing the above-described features, it has an excellent performance and a high reliability.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 1 shows the piezoelectric transformer in accordance with a first embodiment.

FIG. 3 shows the piezoelectric transformer in accordance with a second embodiment.

FIG. 6 shows a conventional gold tread wire with a singly-wounded metallic foil.

FIG. 7 is a side view of a conventional gold tread wire with doubly-wounded metallic foils.

DESCRIPTION OF THE PREFERRED EMBODIMENTS

Figure 1A:
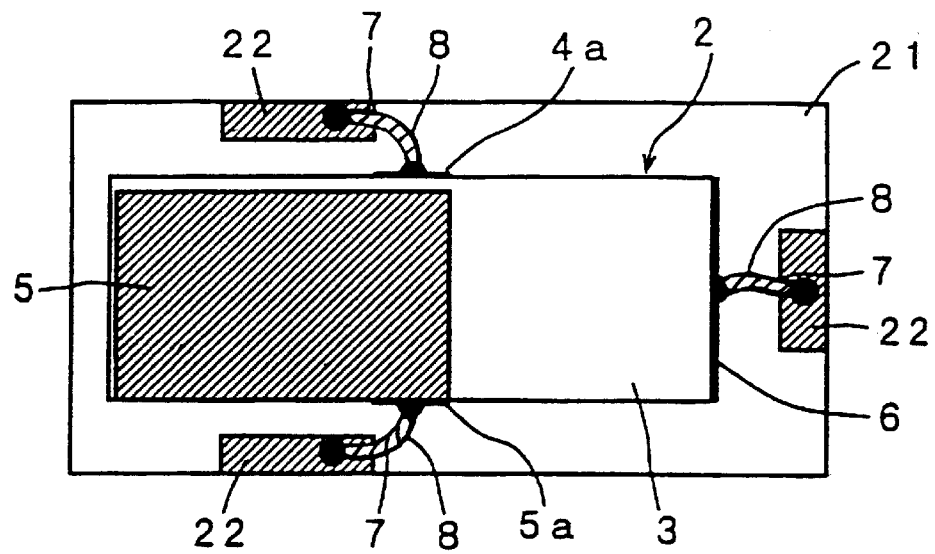
FIG. 1A is a plan view.
Figure 1B:
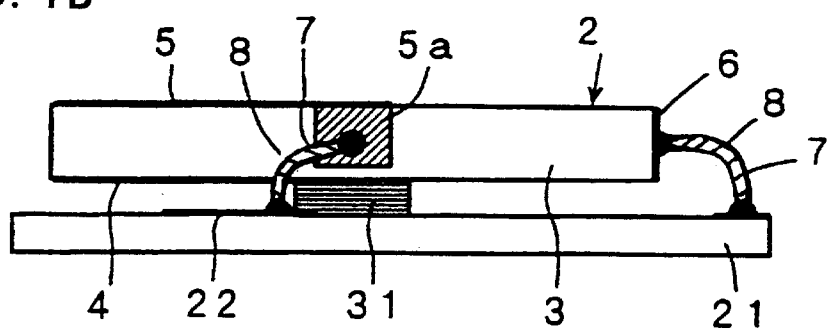
FIG. 1B is a side view.

The construction of the piezoelectric transformer in accordance with the first embodiment of the present invention will be described below with reference to FIGS. 1A, 1B and 2.

This piezoelectric transformer utilizes the basic (primary) vibrational mode called $\lambda/2$ mode of a piezoelectric transformer element 2. The piezoelectric transformer element 2 is constructed by forming, on a piezoelectric plate 3 constituted of rectangular planar piezoelectric ceramic, opposite input electrodes 4 and 5 on the front and rear surfaces of one half side in the longitudinal direction, respectively, and forming a output electrode 6 on the end face of the other half side. In the piezoelectric plate 3, one half side where the input electrodes are formed is polarized in the direction of thickness, while the other half side is polarized in the longitudinal direction. In the piezoelectric transformer element 2, there exists the node of vibration at which a vibration displacement becomes zero at the position of ½ ($\lambda/4$) in the longitudinal direction of the piezoelectric plate 3, while there exists the loop of vibration at which a vibration displacement becomes the maximum at the both ends of the piezoelectric plate 3. A connection portion 4a of the input electrode 4 is formed on one side in the direction of width of the piezoelectric plate 3, and a connection portion 5a of the input electrode 5 is formed on the other opposing side. Here, these both sides are areas corresponding to the above-mentioned node of vibration.

The piezoelectric transformer element 2 is supported and fixed by double-faced adhesive tape 31 having elasticity, on the portion corresponding to the node of vibration on a mounting board 21. Ends of the gold thread wires 7 and 7 for input wiring are each soldered to the connection portions 4a and 5a of the input electrodes 4 and 5, and one end of the gold thread wire 7 for output wiring is soldered to the output electrode 6. The other end of each gold thread wire 7 is soldered to the terminal electrode 22 of the wiring patterns on the mounting board 21.

Figure 2:
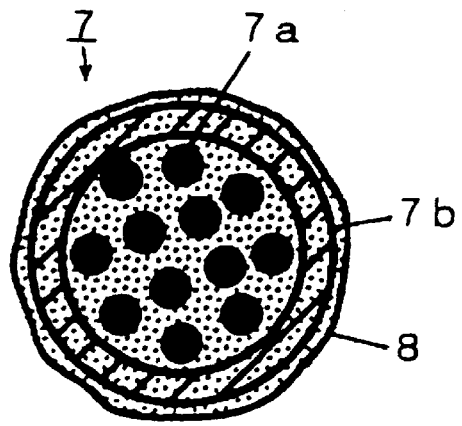
FIG. 2 is a transverse sectional view of a gold thread wire used for the piezoelectric transformer of the first embodiment.

The gold thread wire 7 of the present embodiment has a structure wherein a band-like metallic foil 7b is wound around a core 7a consisting of numerous fine wires bundled, as shown in FIG. 2, and the outer peripheral surface and the inside of the gold thread wire 7 is coated with, and penetrated into by wax 8 as a coating material. More specifically, at a stage prior to the soldering, the gold thread wire 7 is impregnated with wax melted by the soaking of the gold thread wire 7 in wax 8 melted. As wax 8, a petroleum base wax such as paraffin wax, microwax, or petrolatum wax are employed.

The core 7a is constructed by bundling numerous fine wires of heat-resisting chemical fibers, or by weaving the numerous fine wires bundled into the shape of rope. The metallic foil 7b is composed of copper or alloy of copper containing tin, and is formed by rolling a material of bus wire having, for example, a diameter of 0.1 mm into the shape of band (tape).

In the piezoelectric transformer of the present embodiment, the outer peripheral surface and the inside of the gold thread wire 7 is coated with, and penetrated into by (impregnated with) wax 8, and hence, even if the gold thread wire 7 vibrates at the state of contacting the piezoelectric plate 3 or the mounting board 21, it slips off by virtue of the wax 8, and hence the occurrence of the soundings caused by the contact being prevented, the wear of the metallic foil 7b being prevented, which leads to the inhibition of the thinning or breaking of the gold thread wire 7.

Since the metallic foil 7b of the gold thread wire 7 is separated from air by the wax 8, the oxidation of the metallic foil 7b is prevented, and thereby a bad soldering such as a cold joint due to the oxidation of the gold thread wire 7 is avoided.

In addition, since the wax 8 penetrates to the inside of the gold thread wire 7, the wicking of solder to the inside of the gold thread wire during soldering is significantly suppressed. This allows the flexibility of the gold thread wire to be maintained, which leads to the prevention of the deterioration of performance of the gold thread wire.

In the above-described embodiment, the explanation was given taking, as an example, the piezoelectric transformer wherein the gold thread wires are used for connecting with both the input electrodes and the output electrode. However, gold thread wires impregnated with wax may be used only when connecting them with the output electrode existing at the loop of vibration. That is, in the construction of the piezoelectric transformer element, because each connection portion of the input electrodes is disposed at the node of vibration, leads other than gold thread wires may be used for the connection with the input electrodes. Also, the input electrodes and the terminal electrodes on the mounting board may be directly connected using an electrically conductive adhesive or the like.

In the above-described embodiment, there was shown a gold thread wire wherein a metallic foil is singly wound around the core, but the gold thread wire is not limited to such a gold thread wire with singly-wound metallic foil. Alternatively, a gold thread wire having a structure wherein metallic foils are wound two times or more around the core in the same direction or in the directions such that the plural metallic foils mutually intersect, may be used. In the case of the gold thread wire with doubly-wound metallic foils, wax also penetrates between a first ply and a second ply of the metallic foils, and thereby it can also prevent the wear due to the friction between the first and second plies of the metallic foils.

In the above-described embodiment, the explanation of gold thread wire was given taking, as an example, the gold thread wire that is impregnated with wax prior to soldering of the gold thread wire. However, the gold thread wire may be soldered before it is impregnated with wax melted by applying the wax to the gold thread wire. Alternatively, the gold thread wire that is produced by previously coating a metallic foil with wax, and winding the metallic foils coated with wax around the core, may be used.

Figure 3A:
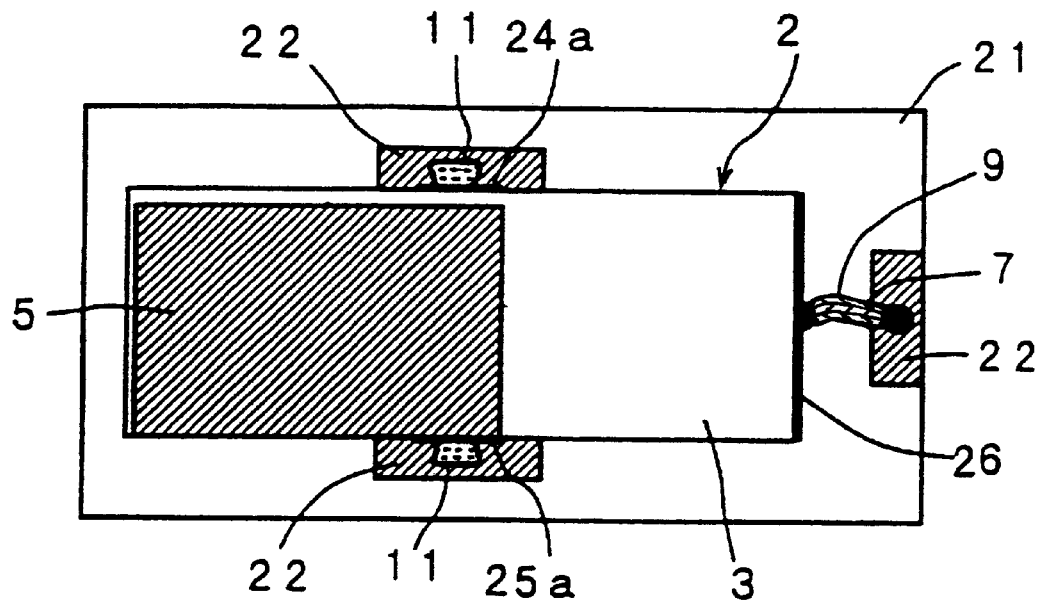
FIG. 3A is a plan view.
Figure 3B:
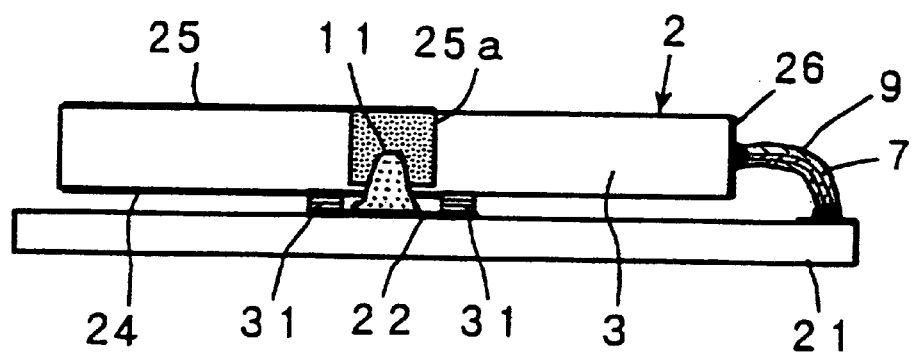
FIG. 3B is a side view.

Next, the construction of the piezoelectric transformer in accordance with the second embodiment of the present invention is described below in reference to FIGS. 3A, 3B and 4.

In the piezoelectric transformer of the present embodiment, a piezoelectric transformer element 2 is supported and fixed by double-faced adhesive tape 31 having elasticity, on two spots in the vicinity of the node of vibration on a mounting board 21. The connection portions 24a and 25a of input electrodes 24 and 25 and the terminal electrode 22 of a mounting board 21 are connected with a electrically conductive adhesive 11, and an output electrode 26 and the terminal electrodes 22 of the mounting board 21 are connected by soldering gold thread wires 7 thereto.

Figure 4:
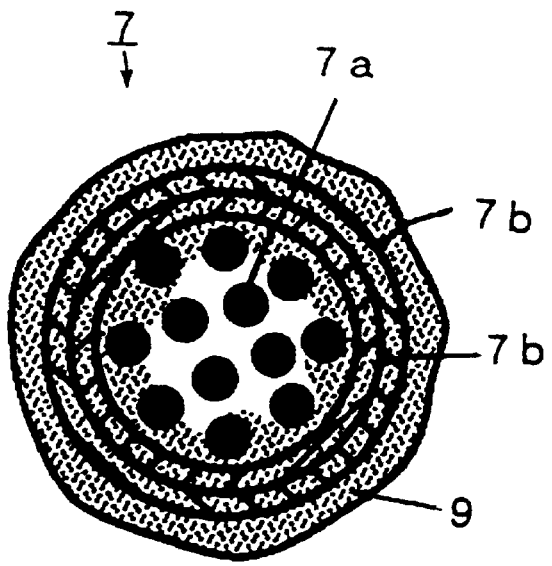
FIG. 4 is a transverse sectional view of a gold thread wire used for the piezoelectric transformer of the second embodiment.

The gold thread wire 7 of the present embodiment has, as shown in FIG. 4, a doubly-wound metallic foil structure wherein two band-like metallic foils 7 are wound spirally around the core 7a in the directions such that the two metallic foils intersect each other, and the gold thread wire 7 is coated with, and penetrated into by a silicone-base adhesive 9 as a coating material. More specifically, the gold thread wire 7 is coated with, and penetrated into by a silicone-base adhesive 9, soldering the gold thread wire 7 without any coating and thereafter applying the silicone-base adhesive 9 to the gold thread wire with the aide of a dispenser or the like.

As a silicone-base adhesive 9, a material that least inhibits the vibration of the piezoelectric transformer element 2, that is, a flexible material that does not deteriorate the performance of the piezoelectric transformer is employed. It is also desirable to use a material with a high fluidity such as to penetrate to a more inner portion of the gold thread wire as well as the outer peripheral surface thereof. Because other constructions are the same that was described in the first embodiment, the explanation thereof are omitted.

In the piezoelectric transformer of the present embodiment, the gold thread wire 7 is coated with, and penetrated into by the silicone-base adhesive 9, and hence, even if the gold thread wire 7 vibrates at the state of contacting the piezoelectric plate 3 or the mounting board 21, the contact conditions are mitigated by the silicone-base adhesive 9. This prevents the occurrence of the soundings caused by the contact and the wear of the metallic foil 7b, and thereby inhibits the wear due to the friction between the first and second plies of the metallic foils 7b, leading to the prevention of the gold thread wire 7 from thinning or breaking.

In the above-described embodiment, the explanation of a gold thread wire was made taking, as an example, the gold thread wire to which the silicone-base adhesive is applied after soldering the gold thread wire. However, in advance of the soldering of the gold thread wire, the gold thread wire may be coated with, and penetrated into by the silicone-base adhesive by applying the silicone-base adhesive to the gold thread wire. Further, by making the silicone-base adhesive penetrate to the inside of the gold thread wire, it is possible to prevent solder from wicking to the inside of the gold thread wire during soldering, maintaining the flexibility of the gold thread wire, and thereby preventing the piezoelectric transformer from the deterioration of the performance.

Alternatively, a gold thread wire that is produced by previously coating the metallic foil with the silicone-base adhesive, and winding the metallic foil coated with the silicone-base adhesive around the core, may be used.

In the present embodiment, the coating material for coating and penetrating into a gold thread wire is not limited to the silicone-base adhesive, but another resin adhesive such as an urethane-base adhesive, or a butyl-rubber-base adhesive may be used as a flexible coating material. Also, a lubricating oil such as silicon oil and grease may be employed.

In the present embodiment, the explanation of the gold thread wire was made taking, as an example, the gold thread wire wherein two metallic foils are doubly wound around the core, but the gold thread wire is not limited to the gold thread wire with doubly-wound metallic foils. Alternatively, a gold thread wire having a structure wherein a singly-wound metallic foil or triply-wound metallic foils are wound around the core, may be used.

In each of the above-described embodiments, the explanation of a piezoelectric transformer element was given taking, as an example, the piezoelectric transformer element that is supported and fixed by double-faced adhesive tape, on the mounting board. However, in order to support the piezoelectric transformer element on the mounting board, a rubber-like or gel-like silicone-base adhesive may be used. Further, by using a metallic terminal or an electrically conductive adhesive, each of the above-described embodiments may be arranged so as to have a structure that has both capabilities of electric connection and support and fixing.

Means for connecting a gold thread wire and an electrode is not limited to soldering, but an electrically conductive adhesive may be used for the connection between the gold thread wire and the electrode.

In addition, the mounting board in the present invention is not limited to a planar board, but the mounting board may be of structure with terminal electrodes formed on a resin case or the like. Further, the mounting board may be arranged so that other circuit elements are mounted by forming electrode patterns which constitute circuit sections other than the terminal electrodes.

In each of the above-described embodiments, a single-plate piezoelectric transformer element of the basic vibration mode was explained by way of example. However, the piezoelectric transformer may be one having a laminar structure or one having a vibration mode of a secondary or higher order. Also, the formation position of the output electrode is not limited to the longitudinal end face.

Figure 5:
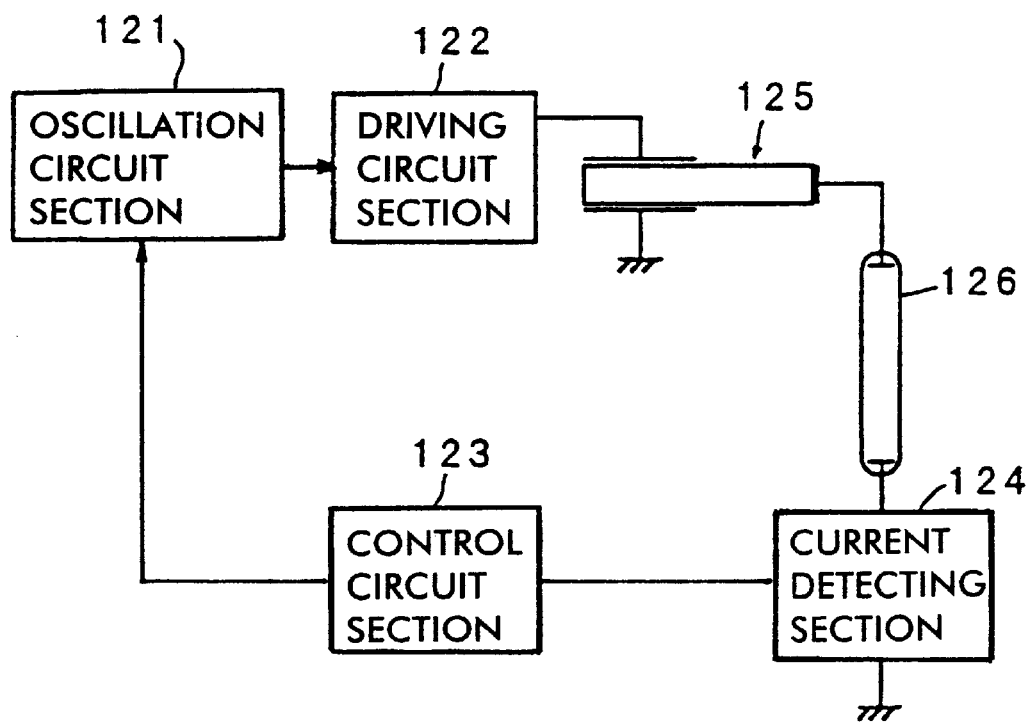
FIG. 5 is a block diagram of the piezoelectric inverter in accordance with a third embodiment.
Figure 6A:
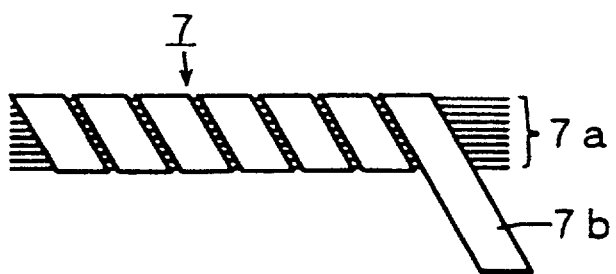
FIG. 6A is a side view.
Figure 6B:
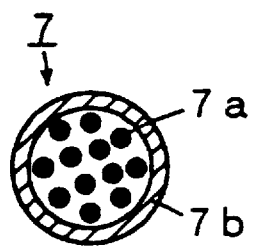
FIG. 6B is a transverse sectional view.
Figure 7A:
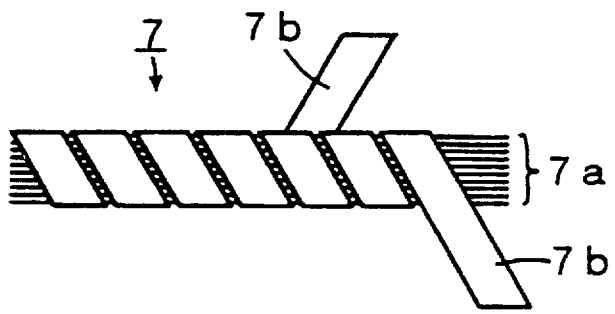
FIG. 7A is one having a structure wherein two metallic foils are wound in the same direction.
Figure 7B:
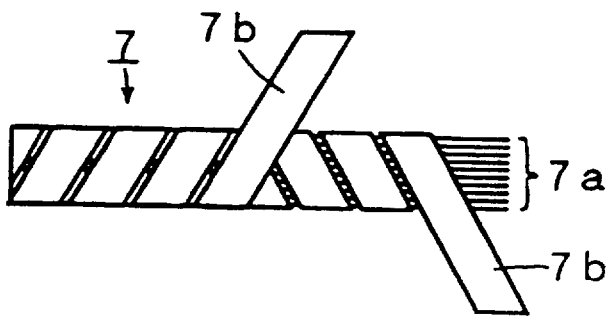
FIG. 7B is one having a structure wherein two metallic foils are wound in the directions such that the two metallic foils intersect each other.

Next, the construction of the piezoelectric inverter in accordance with the third embodiment is shown in FIG. 5. FIG. 5 is a block diagram of a piezoelectric inverter for lighting, for example, the cold cathode-ray tube for use in the backlight of a liquid crystal display. The present inverter is constructed of an oscillation circuit section 121, a driving circuit section 122, a control circuit section 123, a current detecting section 124 and a piezoelectric transformer 125. The cold cathode-ray tube 126 is lighted by actuating the driving circuit section 122 through a signal outputted by the oscillation circuit 121, driving the piezoelectric transformer 125, and applying the increased voltage generated on the secondary side (output electrode) of the piezoelectric transformer 125 to the cold cathode-ray tube 126. Further, the present inverter is constructed so that the current flowing through the cold cathode-ray tube 126 is detected by the current detecting section 124, and that a control signal is fed back from the control section 123 to the oscillation circuit section 121 so as to keep constant the current flowing the cold cathode-ray tube. By forming each of these circuit sections on the mounting board of the first and second embodiments, a piezoelectric inverter unit is constructed.

As a piezoelectric transformer 125 as shown in FIG. 5 the piezoelectric transformer described in the first or second embodiment may be used. Using the piezoelectric transformer in accordance with the present invention, permits a piezoelectric inverter having an excellent performance and a high reliability to be realized.

Moreover, using the piezoelectric transformer or piezoelectric inverter in accordance with the present invention, permits a liquid crystal display having an excellent performance and a high reliability to be implemented.

Also, the piezoelectric transformer in accordance with the present invention finds application in the deflecting high-voltage power circuit of the cathode-ray tube or the high-voltage power circuit of a copier or a facsimile.

As described above, in accordance with the piezoelectric transformer of the present invention, the gold thread wire for wiring is coated with, or coated with, and penetrated into by a coating material such as wax or a resin adhesive with flexibility, and hence, even if the gold thread wire 7 vibrates, it slips off, or the contact conditions thereof are mitigated by virtue of the coating material, which permits the gold thread wire to be prevented from the occurrence of soundings, and from wear of metallic foil due to the friction between the metallic foils and between the metallic foils and members thereabout, thereby permitting the thinning or breaking of the gold thread wire to be prevented.

Furthermore, in accordance with the piezoelectric transformer of the present invention, since the oxidation of metallic foils is suppressed, a bad soldering such as a cold junction can be avoided.

In addition, since the wicking of solder to the inside of gold thread wire during soldering can be suppressed by making a coating material penetrate to the inside, it is possible to maintain the flexibility of the gold thread wire, and thereby to prevent the performance of the piezoelectric transformer from deterioration.

By using the piezoelectric transformer of the present invention, a piezoelectric inverter having an excellent performance and a high reliability can be obtained.

Moreover, by using the piezoelectric transformer or piezoelectric inverter of the present invention, a liquid crystal display having an excellent performance and a high reliability can be obtained.

While the invention has been described in its preferred embodiments, obviously many modifications and variations of the present invention are possible in the light of the above teachings. It is therefore to be understood that within the scope of the appended claims, the invention may be practiced otherwise than as specifically described.

What is claimed is:

1. A piezoelectric transformer comprising a piezoelectric transformer element disposed on a mounting board and a gold thread wire for connecting the electrode of the piezoelectric transformer element and the electrode of the mounting board, wherein:

the metallic foil of said gold thread wire is coated with a coating material.

2. A piezoelectric transformer comprising a piezoelectric transformer element disposed on a mounting board and a gold thread wire for connecting the electrode of the piezoelectric transformer element and the electrode of the mounting board, wherein:

said gold thread wire is coated with, and penetrated into by a coating material.

3. A piezoelectric transformer as claimed in claim 1, wherein said coating material is wax.

4. A piezoelectric transformer as claimed in claim 1, wherein said coating material is a flexible resin adhesive.

5. A piezoelectric transformer as claimed in claim 1, wherein said coating material is a lubricant.

6. A piezoelectric inverter, including the piezoelectric transformer claimed in either claim 1 or claim 2.

7. A liquid crystal display, including the piezoelectric transformer claimed in either claim 1 or claim 2.

8. A piezoelectric transformer as claimed in claim 2, wherein said coating material is wax.

9. A piezoelectric transformer as claimed in claim 2, wherein said coating material is a flexible resin adhesive.

10. A piezoelectric transformer as claimed in claim 2, wherein said coating material is a lubricant.

* * * * *